United States Patent
Belady et al.

(10) Patent No.: US 6,829,142 B2
(45) Date of Patent: Dec. 7, 2004

(54) CELL THERMAL CONNECTOR

(75) Inventors: Christian L. Belady, McKinney, TX (US); Christopher C. Womack, San Diego, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 112 days.

(21) Appl. No.: 10/280,471

(22) Filed: Oct. 25, 2002

(65) Prior Publication Data

US 2004/0080907 A1 Apr. 29, 2004

(51) Int. Cl.[7] .................................................. G06F 1/20
(52) U.S. Cl. ...................... 361/687; 257/714; 165/80.3; 174/15.3
(58) Field of Search .............................. 361/679–687, 361/724–727, 700, 715; 165/80.3, 104.33; 174/15.1, 15.3; 257/714

(56) References Cited

U.S. PATENT DOCUMENTS 6,084,769 A * 7/2000 Moore et al. ............... 361/687
6,362,959 B2 * 3/2002 Tracy ......................... 361/687
6,657,121 B2 * 12/2003 Garner ....................... 174/16.3
6,693,797 B2 * 2/2004 Faneuf et al. ............... 361/689

* cited by examiner

*Primary Examiner*—Hung Van Duong
(74) *Attorney, Agent, or Firm*—Leslie P. Gehman

(57) ABSTRACT

A variable gap thermal interface is coupled with a cold or hot plate, forming a low thermal resistance connection between an electronic device module containing at least one heat generating electronic device and a rack or other structure. The variable gap thermal interface and the cold or hot plate are provided in a configuration to allow quick-disconnect of the electronic device module from the rack, allowing for a wide dimensional tolerance between the module and the rack while maintaining a reliable thermal connection. An embodiment including a plurality of server modules within a server rack in conformance with the present invention, allows the replacement of server modules while powered without any disconnection or reconnection of hoses to cold plates used in cooling the server modules, thus greatly reducing the probability of leaks and resulting damage to the system.

40 Claims, 6 Drawing Sheets

CELL THERMAL CONNECTOR

FIELD OF THE INVENTION

The present invention is related generally to the field of heat transfer and more specifically to the field of thermal contact resistance during heat transfer.

BACKGROUND OF THE INVENTION

As modern electronic devices decrease in size and increase in speed, power density rises dramatically. As power density rises, so does the heat produced by these devices. Traditionally, designers have relied on airflow over heat generating parts for cooling. In vacuum tube systems, large enclosures with numerous ventilation openings allowed the heated air to escape the enclosure. Later systems, such as many personal computers, included fans within an enclosure to draw cool air from outside the enclosure force it over the heat generating devices, and push the warmed air out through ventilation openings.

Many large modern electronic systems require more cooling than simple airflow, whether forced or not, is capable of providing. Some large computers use a network of cold plates plumbed together with water lines to use water as a thermal liquid carrying the heat away from the heat generating devices. Such systems are very expensive and since each cold plate must be plumbed, repair of these systems becomes very complicated. For example, in replacing a circuit board that has one or more heat generating devices cooled by cold plates, each individual cold plate must either be removed from the device or the plumbing must be disconnected from the overall system before the circuit board can be removed. Use of liquid cooling may make hot swapping boards impossible. The connectors for the liquid would have to be opened in areas of the system including live voltages situated such that even a small spill would be very likely to result in a short circuit with resulting damage to the system, and possibly the user. This makes maintenance of such systems more time-consuming and therefore more costly, particularly when including the risk of leaks.

Modern computer servers often comprise a number of individual server modules plugged into racks that supply power to the modules and interconnect the modules to memory, storage, and each other. Such racks present difficult thermal problems, since a large number of heat generating devices are often placed within relatively small server modules that are then placed together tightly in the rack. Ventilation may be constrained by the rack and it's necessary components, and by the fact that often users will want to place servers close together to reduce floor space required in their computer rooms. Liquid cooling becomes very attractive in situations like this, since liquids are capable of carrying a much greater thermal load than air. However, liquid cooling each server module would require plumbing each server module which, while possible, would eliminate much of the benefit of having readily replaceable server modules.

Another problem encountered in systems allowing easy replacement of boards is the issue of tolerance between the board and the rack. Often even boards of identical design will have small manufacturing tolerance differences in their dimensions. Thermal transfer systems relying on contact between a board and an external heat sink may require a greater dimensional tolerance from board to board than may be available with standard thermal grease or elastomeric conductors. Thermal grease only provides a few mils of tolerance. For many applications this is insufficient. This problem only gets worse when systems do not have dedicated slots for each board design, but allow differing boards to be placed in any given location. These different boards may include different thermal transfer needs. They may include heat sinks at different locations on the board and may generate different amounts of power. These problems make it difficult to design a simple heat transfer system for a large system that still allows for flexibility of system configurations.

SUMMARY OF THE INVENTION

A variable gap thermal interface is coupled with a cold or hot plate, forming a low thermal resistance connection between an electronic device module containing at least one heat generating electronic device and a rack or other structure. The variable gap thermal interface and the cold or hot plate are provided in a configuration to allow quick-disconnect of the electronic device module from the rack, allowing for a wide dimensional tolerance between the module and the rack while maintaining a reliable thermal connection. An embodiment including a plurality of server modules within a server rack in conformance with the present invention, allows the replacement of server modules while powered without any disconnection or reconnection of hoses to cold plates used in cooling the server modules, thus greatly reducing the probability of leaks and resulting damage to the system.

Other aspects and advantages of the present invention will become apparent from the following detailed description, taken in conjunction with the accompanying drawings, illustrating by way of example the principles of the invention.

DETAILED DESCRIPTION

Figure 1A:
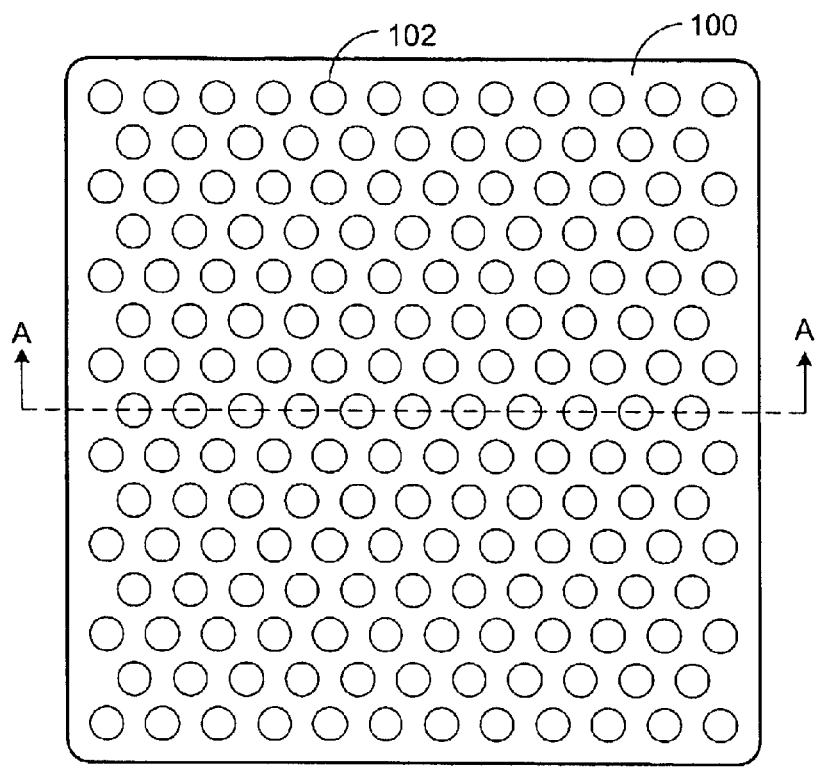
FIG. 1A is a top view of an example embodiment of a variable gap thermal interface.

FIG. 1A is a top view of an example embodiment of a variable gap thermal interface. A variable gap thermal interface may be constructed with a body 100 and an array of pins 102. Further detail of the construction of the array of pins 102 is shown in a cross-sectional view along section line A—A in FIG. 1B. Note that this array of pins 102 may be of any size and dimension within the scope of the present invention. The array of pins 102 may be optimized for a particular purpose by varying such properties as the diameter of the pins, the shape of the pins, the length of the pins, the size of the spring below the pins, and the strength of the spring below the pins, for a given implementation of the present invention.

Figure 1B:
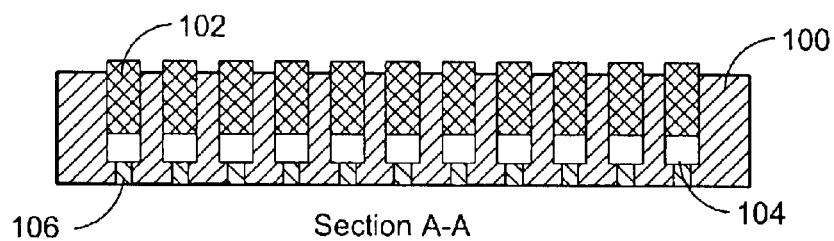
FIG. 1B is a cross-sectional view through section line A—A through the example embodiment of a variable gap thermal interface from FIG. 1A.

FIG. 1B is a cross-sectional view through section line A—A through the example embodiment of a variable gap thermal interface from FIG. 1A. An array of pins 102 is placed within cavities in a thermal interface body 100. Spring elements 104 may reside beneath each pin, applying a vertical force on each pin 102. These spring elements 104 may be constructed in a wide variety of configurations within the scope of the present invention. Some embodiments of the present invention may use small springs or a quantity of deformable material as spring elements. In some embodiments of the present invention the pins 102 may be surrounded by thermal grease to facilitate movement within the cavities in the body 100 and to improve heat transfer between the pins 102 and the body 100. A vent hole 106 may be added to the body if desired. The vent hole 106 may be necessary to allow thermal grease to escape from the cavity when the pin is depressed.

Figure 2:
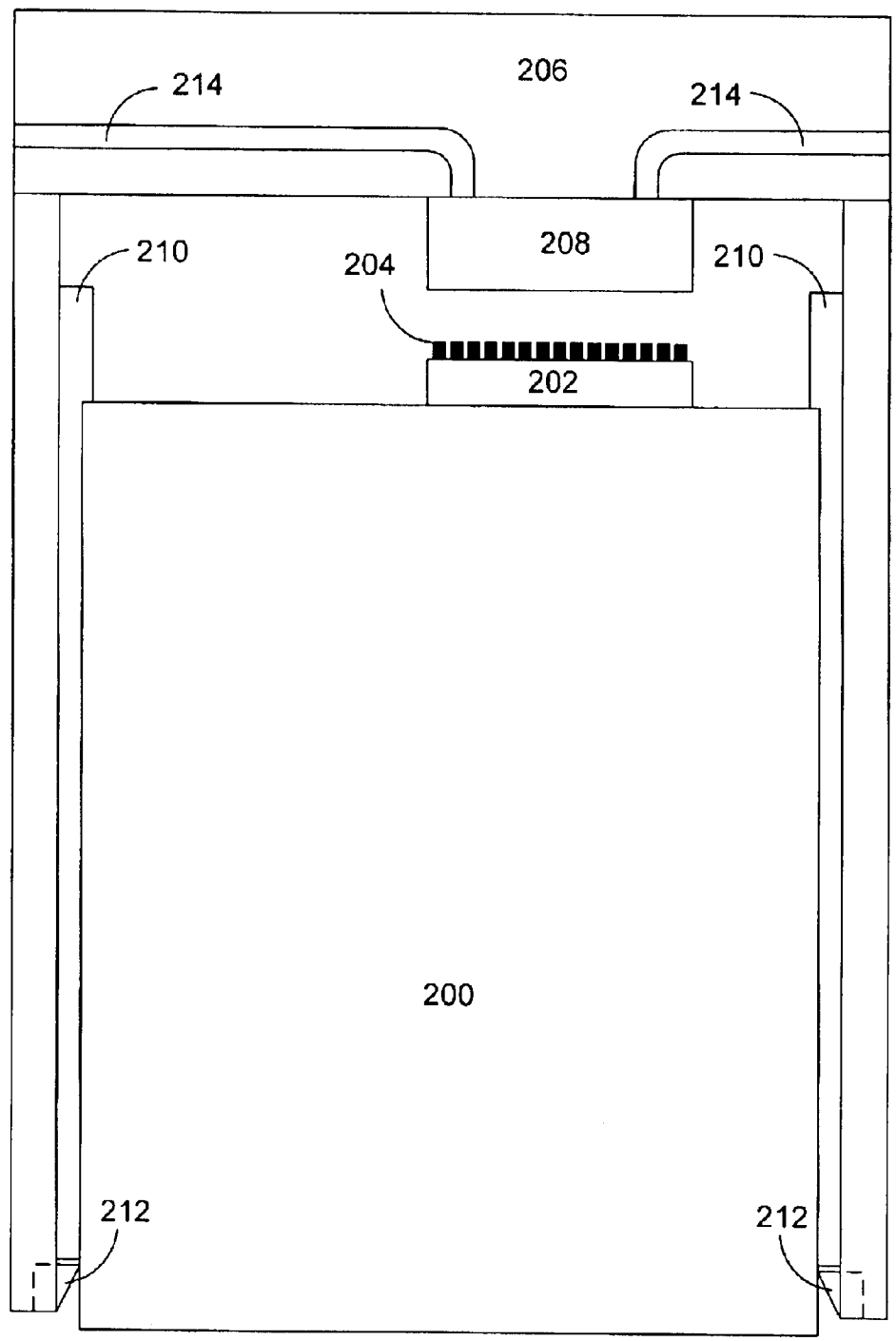
FIG. 2 is a top view of an example embodiment of a docking thermal interface according to the present invention, before docking of the module.

FIG. 2 is a top view of an example embodiment of a docking thermal interface according to the present invention, before docking of a module. A variable gap thermal interface 202 including an array of spring-loaded pins 204 is attached to an electronic device module 200 including heat generating parts. A variety of mechanisms such as a liquid loop, a heat pipe, spray cooling, refrigeration, and other cooling mechanisms may be used to transfer heat from the heat generating parts to the variable gap thermal interface 202 within the scope of the present invention. A cold plate 208 is attached to a rack 206 or other structure that includes the plumbing 214 necessary for the cold plate 208. The rack 206 may include rails 210 for aligning the electronic device module 200 within the rack such that a sufficient portion of the variable gap thermal interface 202 comes in contact with the cold plate 208 as is required to remove heat from the electronic device module 200. The rack 206 may also include latches 212 or other devices to hold the electronic device module 200 in position such that the pins 204 remain in contact with the cold plate 208. Some example embodiments of the present invention may not require all of the variable gap thermal interface 202 to contact the cold plate 208. Note that the surface of the cold plate 208 does not need to be perfectly flat or parallel to the variable gap thermal interface 202 to create a low thermal resistance connection. Since the pins are individually compressible, the variable gap thermal interface 202 will form a low thermal resistance contact with non-planar cold plates 208. Other embodiments of the present invention may be configured to allow a variety of different electronic device modules 200 to be used in a single position within the rack 206 by providing a large cold plate 208 configured to mate with a wide variety of sizes and positions of variable gap thermal interfaces 202. Note that typical designs including the present invention will also include electrical connections such as power lines between the electronic device module 200 and the rack 206. Note that the alignment of the electronic device module 200 to the rack 206 is not critical, since the presence of spring-loaded pins 204 in the present invention still creates a robust thermal interface with the cold plate 208 even with a misalignment. The variable gap thermal interface 202 does not need to be perfectly parallel to the cold plate 208 when in use, since it is possible for some of the pins to be compressed further than other pins. Also, in some embodiments of the present invention, thermal grease may be applied to the surface of the cold plate 208 or the pins further reducing the thermal resistance of the thermal contact formed when the module is docked.

Note that the cold plate 208 on the rack 206 does not necessarily need to be liquid cooled within the scope of the present invention. Some embodiments of the present invention may include an array of heat sinks thermally coupled to the cold plate 208 and configured to utilize airflow for heat dissipation. Other embodiments of the present invention may include heat pipes thermally connected to the cold plate 208 to transfer heat away from the cold plate 208. Still other embodiments of the present invention may use techniques such as spray cooling, standard refrigeration techniques, a thermosyphon, or thermoelectrics to transfer heat away from the cold plate 208.

In some embodiments of the present invention the rack 206 may contain a single large cold plate 208 configured to couple with a plurality of variable gap thermal interfaces 202, while other embodiments of the present invention may contain a single variable gap thermal interface 202 configured to couple with a plurality of cold plates 208. This allows a single large cold plate or variable gap thermal interface to be built into a rack in a configuration allowing a plurality of electronic device modules to transfer heat to the single large cold plate or variable gap thermal interface.

Figure 3:
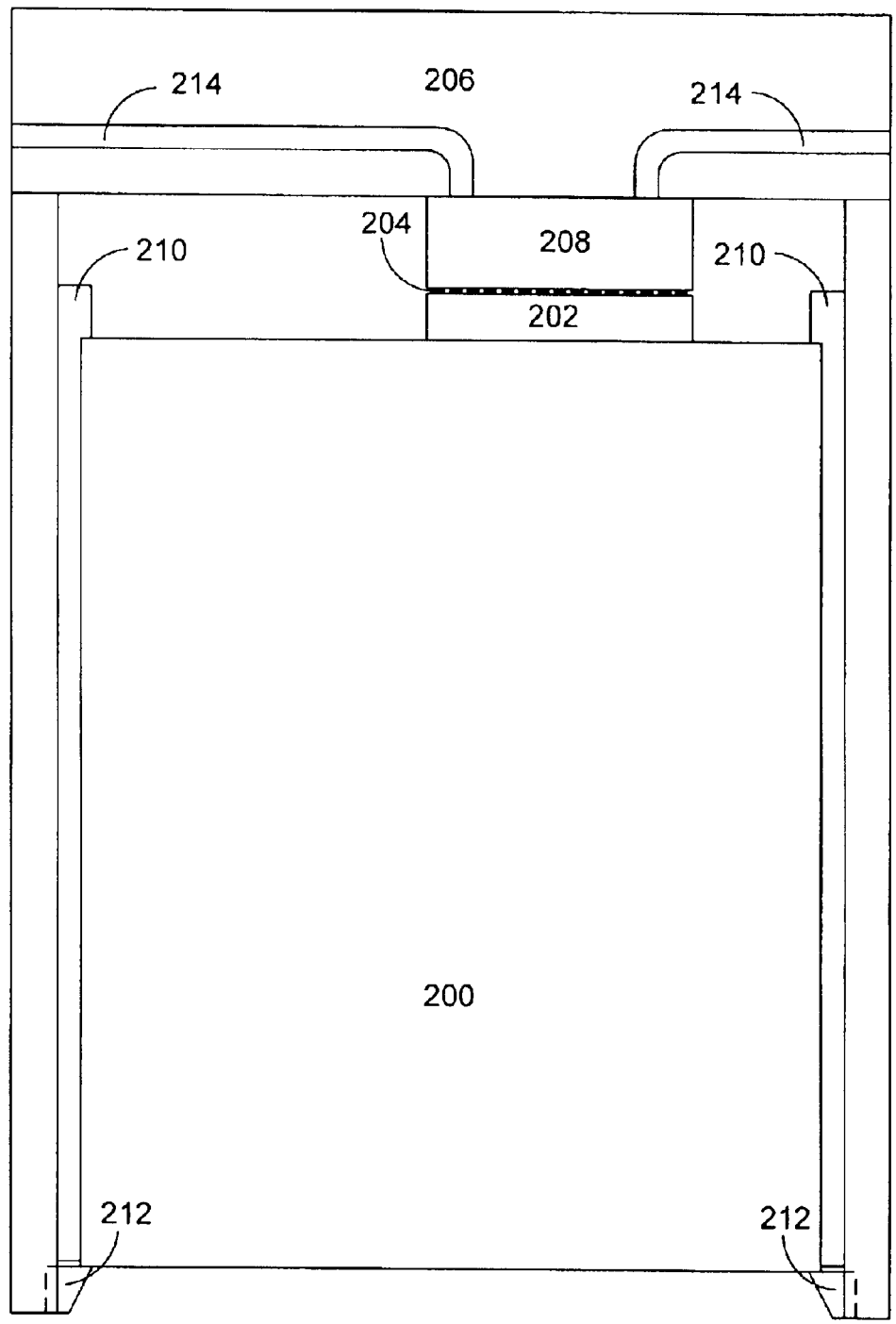
FIG. 3 is a top view of an example embodiment of a docking thermal interface according to the present invention, after docking of the module is completed.

FIG. 3 is a top view of an example embodiment of a docking thermal interface according to the present invention, after docking of a module is completed. In this example embodiment of the present invention, the electronic device module 200 including a variable gap thermal interface 202 from FIG. 2 is docked with the rack 206 resulting in at least some of the array of spring-loaded pins 204 to come in contact with the cold plate 208. Latches 212, or other mechanical devices, may be used to hold the electronic device module 200 in place with respect to the rack 208 to keep the pins 204 in contact with the cold plate 208. In this example embodiment of the present invention spring-loaded latches 212 are used to hold the electronic device module 200 in position, however, those of skill in the art will recognize that may other equivalent devices and configurations may be used to hold the electronic device module 200 in position.

Figure 4:
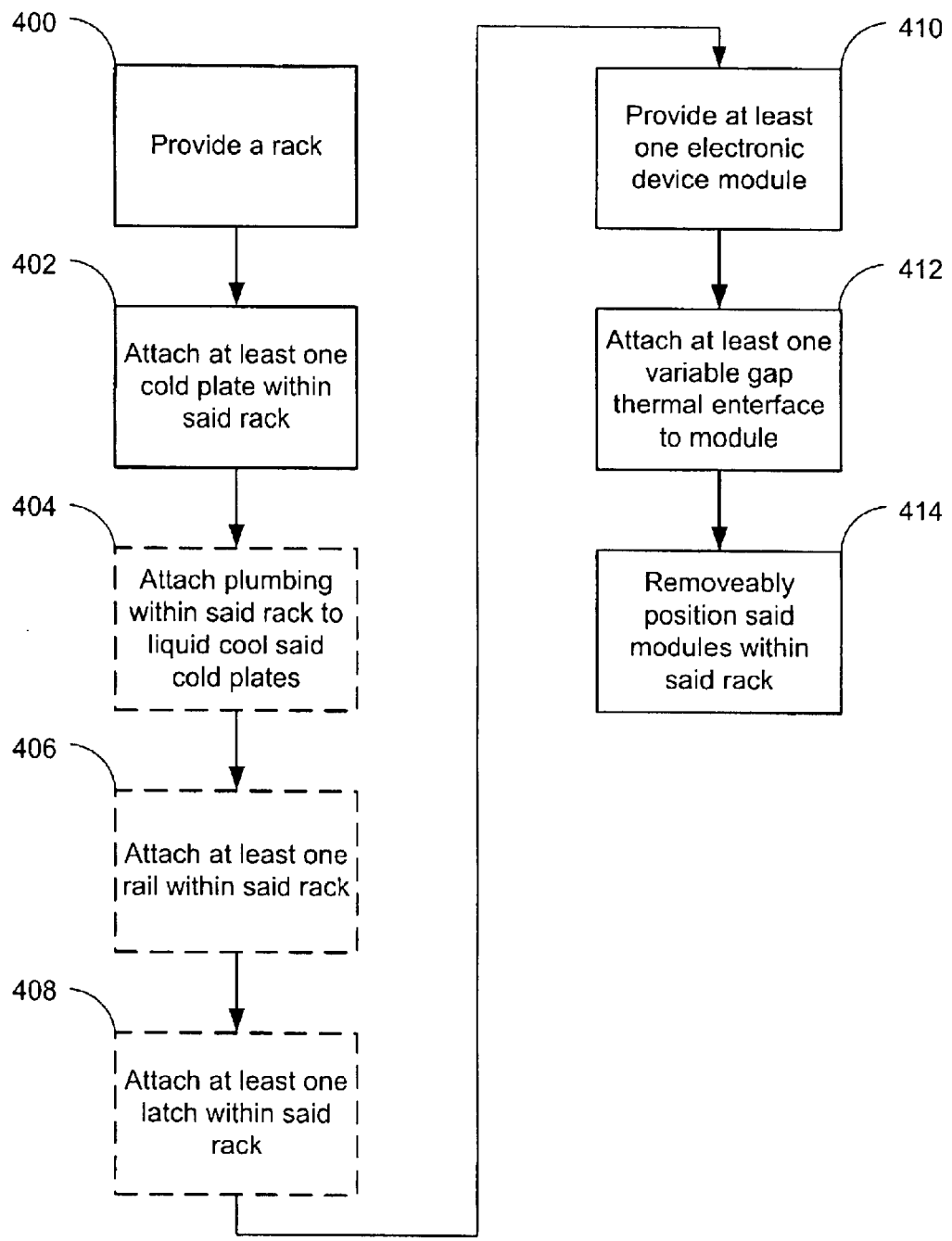
FIG. 4 is a flowchart of an example method of cooling an electronic device module according to the present invention.

FIG. 4 is a flowchart of an example method of cooling an electronic device module according to the present invention. In a step 400 a rack is provided. In a step 402 at least one cold plate is attached to the rack. In an optional step 404 plumbing is attached to the cold plates within the rack configured to liquid cool the cold plates. In an optional step 406 at least one rail is attached to the rack configured to position an electronic device module within the rack. In an optional step 408 at least one latch is attached to the rack configured to secure an electronic device module within the rack. In a step 410 at least one electronic device module is provided. In a step 412 at least one variable gap thermal interface is attached to at least one of the provided electronic device modules. In a step 414 the electronic device module is removeably positioned within the rack such that the variable gap thermal interface contacts at least one of the cold plates within the rack.

Figure 5:
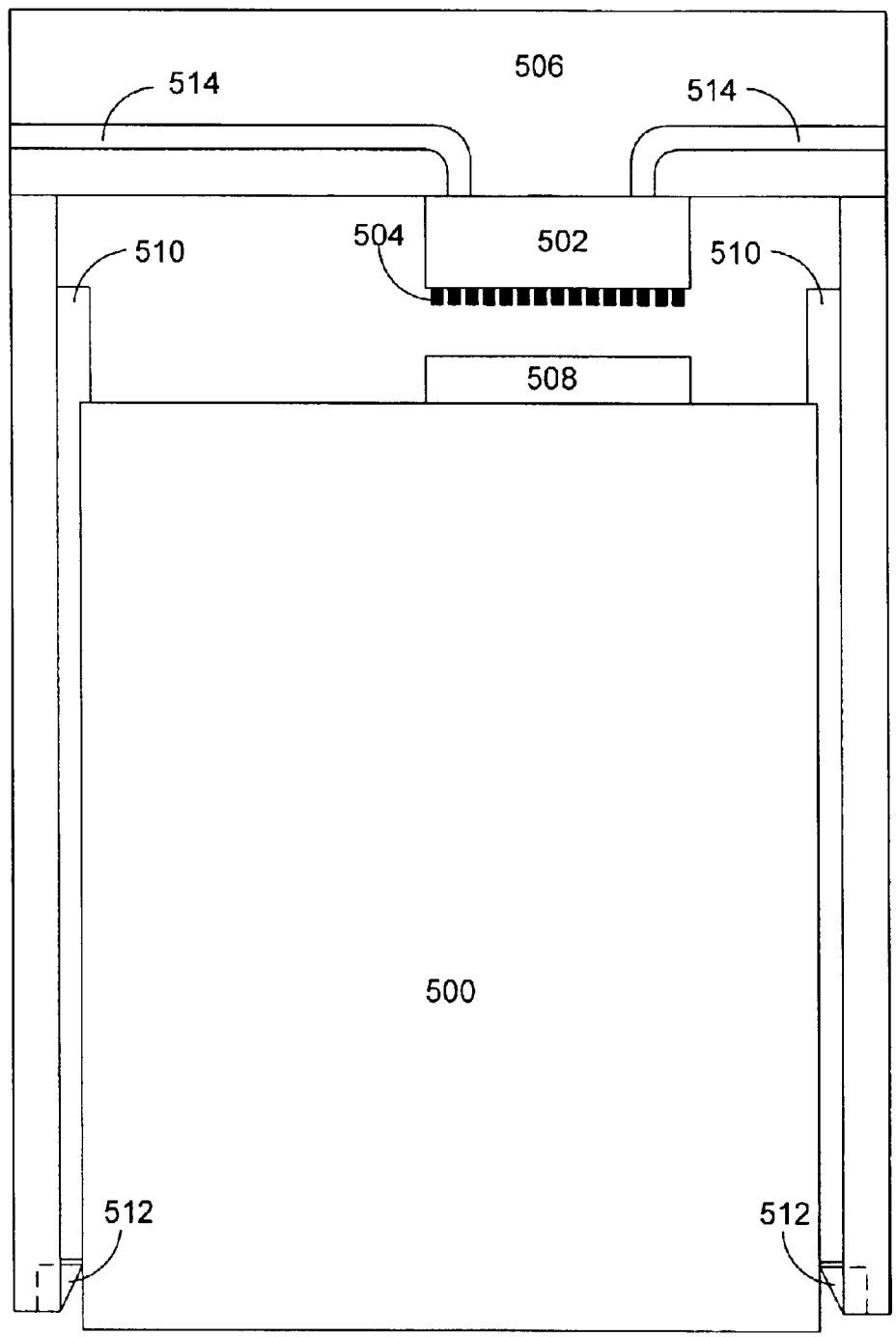
FIG. 5 is a top view of an example embodiment of a docking thermal interface according to the present invention, before docking of the module.

FIG. 5 is a top view of an example embodiment of a docking thermal interface according to the present invention, before docking of the module. This embodiment of the present invention is similar to that shown in FIG. 2, with the exception that the variable gap thermal interface is now on the rack side of the thermal interface. A variable gap thermal interface 502 including an array of spring-loaded pins 404 is attached to a rack 506 including heat dissipation means. A hot plate 508 is attached to an electronic device module 500 including at least one heat generating part. A variety of mechanisms such as a liquid loop or a heat pipe may be used to transfer heat from the heat generating parts to the hot plate 508 within the scope of the present invention. The rack 506 may include rails 510 for aligning the electronic device module 500 within the rack 506 such that a sufficient portion of the hot plate 508 comes in contact with the variable gap thermal interface 502 as is required to remove heat from the electronic device module 500. The rack 506 may also include latches 512 or other devices to hold the electronic device module 500 in position such that the pins 504 remain in contact with the hot plate 508. The rack 506 may include plumbing to liquid cool the variable gap thermal interface 502.

Figure 6:
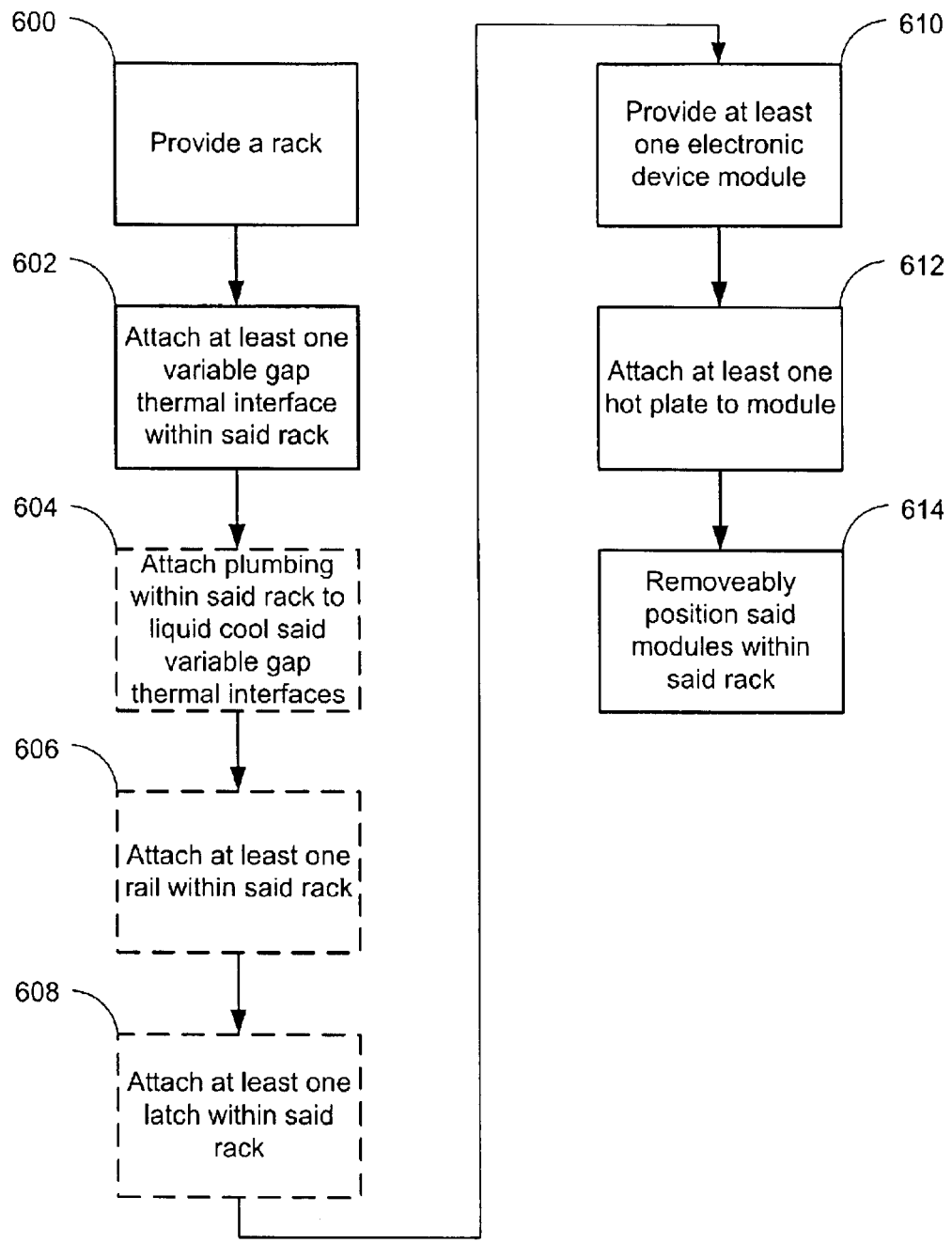
FIG. 6 is a flowchart of an example method of cooling an electronic device module according to the present invention.

FIG. 6 is a flowchart of an example method of cooling an electronic device module according to the present invention. In a step 600 a rack is provided. In a step 602 at least one variable gap thermal interface is attached to the rack. In an optional step 604 plumbing is attached to the cold plates within the rack configured to liquid cool the variable gap thermal interfaces. In an optional step 606 at least on rail is attached to the rack configured to position an electronic device module within the rack. In an optional step 608 at least one latch is attached to the rack configured to secure an electronic device module within the rack. In a step 610 at least one electronic device module is provided. In a step 612 at least one hot plate is attached to at least one of the provided electronic device modules. In a step 614 the electronic device module is removeably positioned within the rack such that the variable gap thermal interface contacts at least one of the cold plates within the rack.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An electronic device comprising:
   a rack;
   at least one cold plate mechanically attached to said rack; and
   at least one electronic device module, including a variable gap thermal interface configured to contact said at least one cold plate only when said electronic device module is inserted into said rack.

2. An electronic device as claimed in claim 1, further comprising
   at least one rail configured to position said at least one electronic device module within said rack such that said variable gap thermal interface contacts said at least one cold plate when said electronic device module is inserted into said rack.

3. An electronic device as claimed in claim 1, further comprising:
   at least one latch configured to hold said at least one electronic device module in position within said rack such that said variable gap thermal interface contacts said at least one cold plate.

4. An electronic device as claimed in claim 1, wherein said rack includes plumbing configured to liquid cool said at least one cold plate.

5. An electronic device as claimed in claim 1, wherein said rack includes at least one heat pipe thermally coupled with said at least one cold plate.

6. An electronic device as claimed in claim 1, wherein said at least one cold plate is air-cooled.

7. An electronic device as claimed in claim 1, wherein said variable gap thermal interface includes a plurality of spring-loaded pins configured to contact said at least one cold plate.

8. An electronic device as claimed in claim 1, further comprising:
   thermal grease between said variable gap thermal interface and said cold plate.

9. An electronic device as claimed in claim 1, wherein said electronic device is a computer server.

10. An electronic device as claimed in claim 7, wherein said variable gap thermal interface includes a body and further includes thermal grease between said body and said spring-loaded pins.

11. An electronic device as claimed in claim 9, wherein said electronic device module is a computer server module.

12. An electronic device comprising:
    means for supporting at least one electronic device module;
    means for cooling at least one cold plate;
    means for positioning said at least one electronic device module such that at least one variable gap thermal interface in said at least one electronic device modules contacts said at least one cold plate only when said electronic device module is inserted into said means for supporting at least one electronic device module.

13. An electronic device as claimed in claim 12, further comprising:
    means for securing said at least one electronic device module when positioned such that at least one variable gap thermal interface in said at least one electronic device modules contacts said at least one cold plate.

14. An electronic device as claimed in claim 12, wherein said means for cooling said at least one cold plate includes plumbing a liquid through said cold plate.

15. A method for cooling electronic device modules, comprising the steps of:
    a) providing a rack;
    b) attaching at least one cold plate within said rack;
    c) providing at least one electronic device module;
    d) attaching at least one variable gap thermal interface to said electronic device module; and
    e) removeably positioning said at least one electronic device module within said rack such that said at least one variable gap thermal interface contacts said at least one cold plate only when said electronic device module is inserted into said rack.

16. A method for cooling electronic device modules as claimed in claim 15, further comprising the step of:
    f) attaching at least one rail within said rack configured to position said at least one electronic device module within said rack such that said at least one variable gap thermal interface contacts said at least one cold plate.

17. A method for cooling electronic device modules as claimed in claim 15, further comprising the step of:
    f) attaching at least one latch within said rack configured to secure said at least one electronic device module in position within said rack.

18. A method for cooling electronic device modules as claimed in claim 15, further comprising the step of:

f) attaching plumbing within said rack, configured to liquid cool said at least one cold plate.

19. A method for cooling electronic device modules as claimed in claim 15, further comprising the step of:
   f) attaching at least one heat pipe within said rack, configured to cool said at least one cold plate.

20. A method for cooling electronic device modules as claimed in claim 15, further comprising the step of:
   f) placing thermal grease between said variable gap thermal interface and said at least one cold plate.

21. An electronic device comprising:
   a rack;
   at least one variable gap thermal interface mechanically attached to said rack; and
   at least one electronic device module, including at least one hot plate configured to contact said at least one variable gap thermal interface only when said electronic device module is inserted into said rack.

22. An electronic device as claimed in claim 21, further comprising:
   at least one rail configured to position said at least one electronic device module within said rack such that said variable gap thermal interface contacts said at least one hot plate when said electronic device module is inserted into said rack.

23. An electronic device as claimed in claim 21, further comprising:
   at least one latch configured to hold said at least one electronic device module in position within said rack such that said variable gap thermal interface contacts said at least one hot plate.

24. An electronic device as claimed in claim 21, wherein said rack includes plumbing configured to liquid cool said at least one variable gap thermal interface.

25. An electronic device as claimed in claim 21, wherein said rack includes at least one heat pipe thermally coupled with said at least one variable gap thermal interface.

26. An electronic device as claimed in claim 21, wherein said at least one variable gap thermal interface is air-cooled.

27. An electronic device as claimed in claim 21, wherein said variable gap thermal interface includes a plurality of spring-loaded pins configured to contact said at least one hot plate.

28. An electronic device as claimed in claim 21, further comprising:
   thermal grease between said variable gap thermal interface and said hot plate.

29. An electronic device as claimed in claim 21, wherein said electronic device is a computer server.

30. An electronic device as claimed in claim 27, wherein said variable gap thermal interface includes a body and further includes thermal grease between said body and said spring-loaded pins.

31. An electronic device as claimed in claim 29, wherein said electronic device module is a computer server module.

32. An electronic device comprising:
   means for supporting at least one electronic device module;
   means for cooling at least one variable gap thermal interface; and
   means for positioning said at least one electronic device module such that at least one hot plate in said at least one electronic device modules contacts said at least one variable gap thermal interface only when said electronic device module is inserted into said means for supporting at least one electronic device module.

33. An electronic device as claimed in claim 32, further comprising:
   means for securing said at least one electronic device module when positioned such that at least one hot plate in said at least one electronic device modules contacts said at least one variable gap thermal interface.

34. An electronic device as claimed in claim 32, wherein said means for cooling said at least one variable gap thermal interface includes plumbing a liquid through said variable gap thermal interface.

35. A method for cooling electronic device modules, comprising the steps of:
   a) providing a rack;
   b) attaching at least one variable gap thermal interface within said rack;
   c) providing at least one electronic device module;
   d) attaching at least one hot plate to said electronic device module; and
   e) removeably positioning said at least one electronic device module within said rack such that said at least one variable gap thermal interface contacts said at least one hot plate only when said electronic device module is inserted into said rack.

36. A method for cooling electronic device modules as claimed in claim 35, further comprising the step of:
   f) attaching at least one rail within said rack configured to position said at least one electronic device module within said rack such that said at least one variable gap thermal interface contacts said at least one hot plate.

37. A method for cooling electronic device modules as claimed in claim 35, further comprising the step of:
   f) attaching at least one latch within said rack configured to secure said at least one electronic device module in a position within said rack.

38. A method for cooling electronic device modules as claimed in claim 35, further comprising the step of:
   f) attaching plumbing within said rack, configured to liquid cool said at least one variable gap thermal interface.

39. A method for cooling electronic device modules as claimed in claim 35, further comprising the step of:
   f) attaching at least one heat pipe within said rack, configured to cool said at least one variable gap thermal interface.

40. A method for cooling electronic device modules as claimed in claim 35, further comprising the step of:
   f) placing thermal grease between said variable gap thermal interface and said at least one hot plate.

* * * * *